United States Patent [19]
Gheewala et al.

[11] Patent Number: 5,471,152
[45] Date of Patent: Nov. 28, 1995

[54] STORAGE ELEMENT FOR DELAY TESTING

[75] Inventors: Tushar Gheewala, Los Altos; Rustam Mehta, Sunnyvale; Prab Varma, Mountain View, all of Calif.

[73] Assignee: CrossCheck Technology, Inc., San Jose, Calif.

[21] Appl. No.: 133,588

[22] Filed: Oct. 8, 1993

[51] Int. Cl.$^6$ .......................... G01R 31/00; G01R 31/02
[52] U.S. Cl. .......................................... 324/758; 324/73.1
[58] Field of Search ..................... 368/119–120; 324/758; 371/118, 76.35, 22.1, 22.5; 307/308; 326/16; 327/270, 271, 261, 263, 278, 299, 392, 202, 203

[56] References Cited

U.S. PATENT DOCUMENTS

| | | | |
|---|---|---|---|
| 4,540,903 | 9/1985 | Cooke et al. | 307/465 |
| 4,656,649 | 4/1987 | Takahashi | 377/48 |
| 4,843,254 | 6/1989 | Motegi et al. | 307/272.2 |
| 5,065,090 | 11/1991 | Gheewala . | |

OTHER PUBLICATIONS

B. I. Dervisoglu, et al., "Design for Testability: Using Scanpath Techniques for Path–delay Test and Measurement," IEEE Proceedings International Test Conference 1991, Paper 14.1, pp. 365–374.

*Primary Examiner*—Kenneth A. Wieder
*Assistant Examiner*—Barry C. Bowser
*Attorney, Agent, or Firm*—Townsend and Townsend and Crew

[57] ABSTRACT

A storage element for testing delay paths in integrated circuits is described. The storage element may be used in integrated circuits having matrices of probe and sense lines. The storage element generates a logic transition on an input to a delay path, the logic transition being closely synchronized with a clock signal. The storage element comprises a data input and a data output coupled to the input to the delay path. A master latch receives data from the data input through a first switch, the first switch being controlled by the complement of the clock signal. A slave latch receives data from the master latch through a second switch, the second switch being controlled by the true of the clock signal. A first sense input loads a first logic state into the master latch through a third switch, the first sense input being coupled to one of the IC's sense lines. The third switch is controlled by one of the IC's probe lines. A second sense input loads a second logic state into the slave latch through a fourth switch, the second sense input being coupled to another one of the IC's sense lines. The fourth switch is controlled by a second control signal. The second logic state replaces the first logic state in the slave latch upon application of the clock signal. The desired signal transition is generated where the first logic state is different from the second logic state.

6 Claims, 2 Drawing Sheets

STORAGE ELEMENT FOR DELAY TESTING

BACKGROUND OF THE INVENTION

The present invention relates to testing delay paths in integrated circuits. More specifically, a low overhead storage element for delay testing is described.

Manufacturing defects during the fabrication of integrated circuits (ICs) can introduce faults that will cause circuit delays to exceed permissible limits. Such failures, called delay faults, if not detected during IC test, can cause systems incorporating such ICs to fail during system operation. It is therefore desirable to detect delay faults during IC testing.

Automatic test pattern generation (ATPG) for delay testing requires the generation of a sequence of patterns of control and input signals known as test vectors. The test vectors are scanned into a series of storage elements in an integrated circuit using well known scan testing techniques, thereby causing signal transitions on the inputs of signal paths for the purpose of measuring the time required for the transition to propagate through the signal paths. In the past, such signal transitions were generated by a bistable multivibrator or a flip-flop, such as flip-flop 10 shown in FIG. 1. During regular system operation, scan-in and scanout clock signal lines, 12 and 14 respectively, are inactive and the double-strobe and master-load control signal lines, 16 and 18 respectively, are in their deasserted states. This allows flip-flop 10 to operate as a master/slave flip-flop in which master-latch 20 updates with data on input terminal 22 while system clock line 24 is at the logic "0" level, and master-latch 20 is copied into slave-latch 26 with the rising edge of the clock signal. To generate the desired signal transition at output terminal 28 of flip-flop 10, both the double-strobe and master-load control signal lines 16 and 18 must be asserted. Scan-in clock line 12 and scan-out clock line 14 are then used to load the value on scan-in input terminal 29 into both master-latch 20 and slave-latch 26. By deasserting master-load control signal line 18, a different value may then be loaded into slave-latch 26. By then asserting a pulse on clock signal line 24, the contents of master-latch 20 are moved to slave-latch 26, causing the desired signal transition in synchronism with the clock signal transition.

One of the limitations of the above-described flip-flop resides in the fact that an extra holding latch 27 must be incorporated into the flip-flop in order to implement standard scan testing. Therefore, each flip-flop results in a considerable amount of pin-out and die area overhead. For example, the above-described flip-flop requires six additional signal lines and five additional gates. (This is based on the assumption that four transistors are equivalent to one gate). The six additional signals include the scan-in input, the scan-out output, the scan-in clock, the scan-out clock, the double-strobe enable input, and the master-load enable. The additional gates include the two inverters of the scan-out latch as one gate, the two switches driven by the scan-out clock as one gate, the two switches driven by the scan-in clock as one gate, the two switches driven by the master-load enable as one gate, and the OR gate.

Because of the need to reduce the size and pin-out of integrated circuits while, at the same time, maintaining or increasing a sufficient level of fault coverage, there is a need for a storage element for delay testing with a reduced pin-out overhead.

SUMMARY OF THE INVENTION

According to the invention, there is provided in an integrated circuit a storage element for in-circuit testing of delay paths. When addressed through a plurality of sense lines and probe lines, the storage element generates a logic transition at the input to a delay path, the logic transition being closely synchronized with a first control signal, usually a clock signal. The storage element has a data input and a data output, the data output being coupled to the input to the delay path. During delay testing, a master latch of the storage element receives data from the data input through a first switch, the first switch being controlled by the complement of the first control signal. A slave latch receives data from the master latch through a second switch, the second switch being controlled by the true of the first control signal. When the first control signal is high (thus disabling the data input), a first sense input loads a first logic state into the master latch through a third switch, the first sense input being coupled to one of the sense lines. The third switch is controlled by one of the probe lines. A second sense input is for applying a second logic state to the slave latch through a fourth switch, the second sense input being coupled to another one of the sense lines. The fourth switch is controlled by a second control signal. The second logic state replaces the first logic state in the slave latch upon application of the first control signal. The desired signal transition is thus generated where the first logic state is different from the second logic state.

In one embodiment, a flip-flop designed according to the present invention is used in integrated circuits overlaid with a matrix of probe and sense lines as described by commonly assigned U.S. Pat. No. 5,065,090, METHOD FOR TESTING INTEGRATED CIRCUITS HAVING A GRID-BASED, "CROSS-CHECK" TEST STRUCTURE (issued Nov. 12, 1991), the entire specification of which is herein incorporated by reference. Flip-flops designed according to the invention may also be used to capture test results at the end of a delay path. When operating normally (i.e., the sense line inputs are not enabled), data from the data input are clocked into the slave latch with the rising edge of the clock signal. The receiving flip-flop output may then be sensed to determine if an expected transition has occurred within a specified time.

The actual path delay time may also be accurately measured using the present invention in both of the capacities described above. The time between clock pulses is iteratively shortened and the above-described delay test repeated until the expected transition is no longer captured by the receiving flip-flop before the next clock pulse. This occurs when the path delay exceeds the time between the clock pulses. Thus, an accurate measurement of the path delay time may be obtained by determining the minimum clock period for which the expected transition may be captured.

A further understanding of the nature and advantages of the present invention may be realized by reference to the remaining portions of the specification and the drawings.

DESCRIPTION OF THE SPECIFIC EMBODIMENTS

Figure 2:
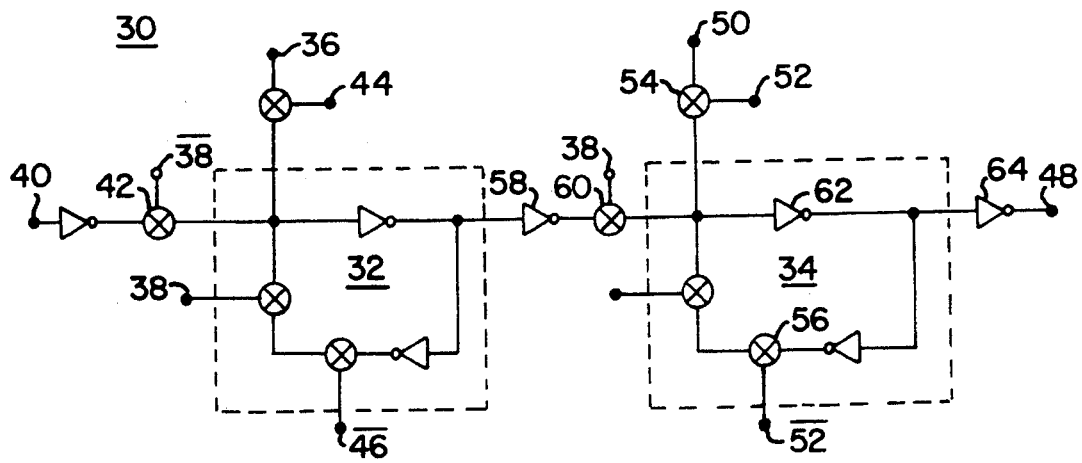
FIG. 2 is a logic diagram of a storage element for delay testing implemented according to one embodiment of the present invention.
Figure 3:
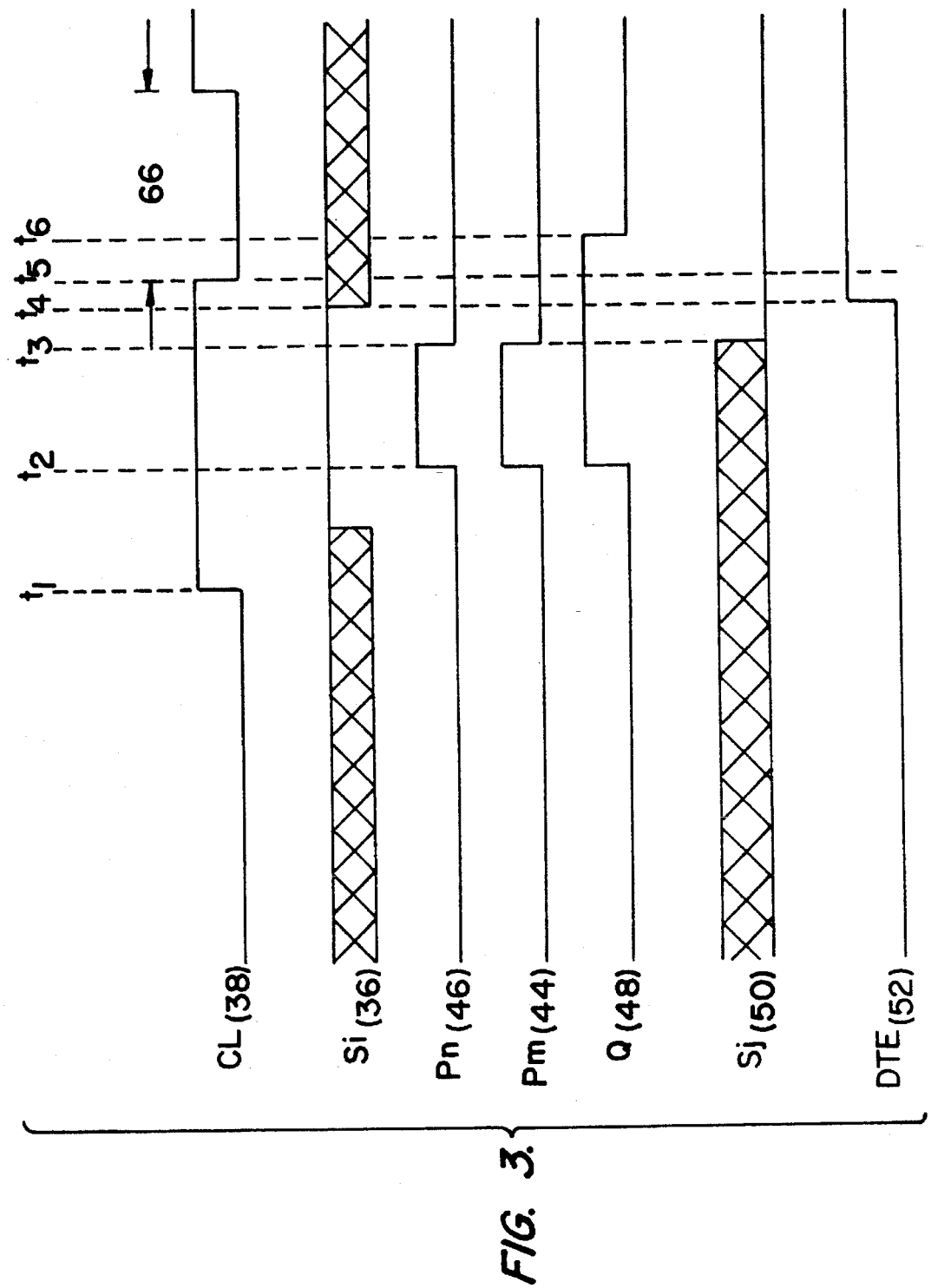
FIG. 3 is a timing diagram showing the relative timing of signals during the generation of a signal transition at the output of a storage element designed according to one embodiment of the present invention.

FIG. 2 is a logic diagram of a flip-flop 30 for delay testing implemented according to one embodiment of the present invention. Signal complements are designated with a bar over the reference designation for the true of the signal. FIG. 3 is a timing diagram showing the relative timing of the sense, probe, and control signals as hereinafter described with reference to FIG. 2. The reference designations are the same as in FIG. 2.

Figure 1:
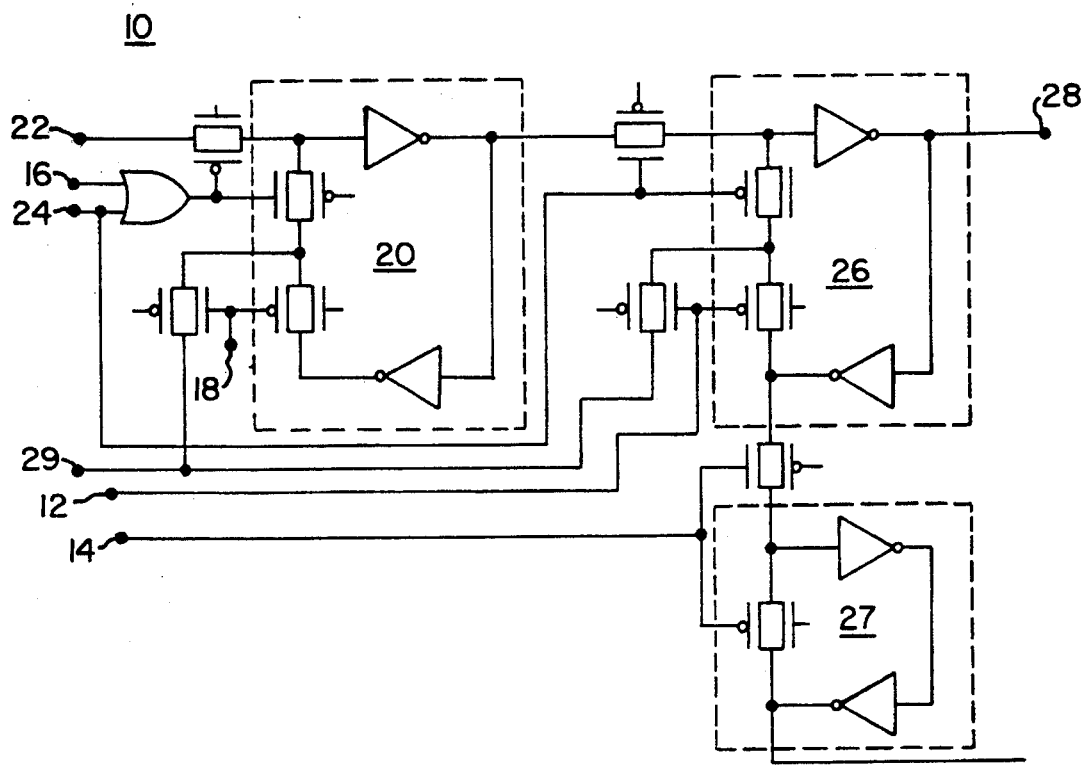
FIG. 1 is a logic diagram of a double-strobe flip-flop for delay testing implemented according to the prior art.

In contrast with the storage element of FIG. 1, flip-flop 30 has only two storage latches, a master-latch 32 and a slave-latch 34. During test, master-latch 32 is written into by applying a desired datum to first sense input terminal 36. At time $t_1$, system clock line 38 is then brought high, disconnecting data input terminal 40 from master-latch 32 by turning gate 42 off. Two probe lines 44 and $\overline{46}$ are then brought high at $t_2$. This, in turn, writes the datum on input terminal 36 to master-latch 32. At $t_3$, the probe lines 44 and $\overline{46}$ are turned off, closing master-latch 32 and retaining the stored datum on output terminal 48 of slave latch 34.

To cause a transition on output terminal 48 in synchronism with a transition on clock line 38, a complementary datum is applied to second sense input terminal 50, at or after $t_3$. Then at $t_4$, delay test enable signal line 52 is made to go high, thereby turning gate 54 on and gate 56 off. However, the output drive of gate 54 is designed to be significantly less than that on gates 58 and 60. Thus, the datum on output terminal 48 will not change unless gate 60 is turned off. When clock line 38 turns off at $t_5$, gate 60 also turns off and the datum on input terminal 50 is transmitted through gates 54, 62, and 64 to output terminal 48, causing a transition soon thereafter at $t_6$. If no transition is desired on a particular flip-flop, the signals on sense input terminals 36 and 50 are made the same.

The transition signal propagates through the delay path under test and may be captured on a receiving flip-flop also designed according to the invention. The receiving flip-flop, operating as a master/slave flip-flop, captures the transition signal in its slave-latch with the rising edge of the system clock. The receiving flip-flop output is then sensed to determine if the expected transition has occurred within a specified time, $t_{crit}$ 66. If a delay fault exists, the transition signal will not reach the receiving flip-flop within the specified time and the test will indicate a failure.

The actual path delay time may also be accurately measured using the present invention to generate the transition signal and capture the test result. The time between successive clock pulses is iteratively shortened and the delay test repeated until the expected transition is no longer captured by the receiving flip-flop before the succeeding clock pulse. This occurs when the path delay exceeds the time between successive clock pulses. Thus, an accurate measurement of the path delay time may be obtained by determining the minimum clock period during which the expected transition may be captured.

In contrast to the flip-flop of FIG. 1, the described embodiment requires only four additional logic gates. The additional gates include the switch driven by $P_m$ (44), the switch driven by the complement of $P_n$ ($\overline{46}$), and the two switches driven by Delay Test Enable (52) and its complement ($\overline{52}$). The additional holding latch is not required to implement standard scan testing. The number of additional signal lines required by the described embodiment varies depending upon the implementation. The generalized embodiment described above shows six additional signals which include sense inputs $S_i$ (36) and $S_j$ (50), probe inputs $P_m$ (44) and $P_n$ ($\overline{46}$), and Delay Test Enable (52) and its complement ($\overline{52}$). In the described embodiment, signals $S_i$, $S_j$, $P_m$, and $P_n$ are arranged in a grid structure commonly known as Cross-Check, and can be used to read out signals stored in flip-flop 30. It should be apparent from the description of the operation of the flip-flop of FIG. 2 that probe inputs $P_m$ and $P_n$ may be collapsed into a single external input with signal inversion taking place locally, thereby further reducing the number of additional signals required. The inversion of signal line 52 may also take place locally resulting in signal line reduction, or, in a more generalized embodiment, line 52 may comprise an entirely different, independently controlled signal line.

It will also be apparent that the above-described sense and probe input lines may be brought into the flip-flop in a variety of ways without departing from the scope of the invention. Thus, the invention is not limited to integrated circuits employing the Cross-Check grid structure. The signal lines used by the flip-flop of the present invention to implement delay testing may be inverted locally, i.e., in the vicinity of the flip-flop, thereby further reducing the number of additional signal lines required. For example, as suggested above, the number of signal lines may be reduced by applying the complement of input 44 to input $\overline{46}$. Furthermore, the Delay Test Enable signals 52 and $\overline{52}$ may be brought in on one line and inverted locally. As few as four additional signal lines into the integrated circuit may be used to fully implement the invention. When deciding how best to implement the flip-flop of the present invention, the designer must balance the overhead associated with bringing additional signal lines into the flip-flop (e.g., increased pin-out) against the costs associated with combining lines (e.g., reduced flexibility) and local inversion (e.g., consumption of die area).

While the invention has been particularly shown and described with reference to specific embodiments thereof, it will be understood by those skilled in the art that the foregoing and other changes in the form and details may be made therein without departing from the spirit or scope of the invention.

What is claimed is:

1. A storage element for generating a logic transition on a delay path input port, the logic transition being closely synchronized with a first control signal, the storage element comprising:

a data input port;

a first switch controlled by the complement of the first control signal;

a master latch coupled to the first switch for receiving data from the data input port through the first switch;

a second switch controlled by the first control signal;

a slave latch coupled to the second switch for receiving data from the master latch through the second switch;

a data output port coupled to the slave latch and the delay path input port;

a third switch controlled by a first probe signal;

a first sense input port coupled to the master latch by means of the third switch, the first sense input port for transmitting a first logic state into the master latch through the third switch, the first sense input port also being coupled to a first sense line;

a fourth switch controlled by a second control signal; and a second sense input port coupled to the slave latch by means of the fourth switch, the second sense input port for applying a second logic state to the slave latch from outside the storage element through the fourth switch, the second sense input port also being coupled to a second sense line, the second logic state replacing the first logic state in the slave latch upon application of the first control signal, thereby generating the logic transition on the delay path input port where the first logic state is different from the second logic state.

2. A storage element for generating a logic transition in an integrated circuit, the integrated circuit having a matrix of probe lines and sense lines, the storage element generating the logic transition on a delay path input port, the logic transition being closely synchronized with a first control signal, the storage element comprising:

a data input port;

a data output port coupled to the delay path input port;

a first inverter having a first inverter input port and a first inverter output port, the first inverter input port being coupled to the data input port;

a first switch having a first side and a second side, the first switch being controlled by the complement of the first control signal, the first side of the first switch being coupled to the first inverter output port;

a second switch having a first side and a second side, the second switch being controlled by a first probe line, the first side of the second switch being coupled to a first sense line, and the second side of the second switch being coupled to the second side of the first switch;

a second inverter having a second inverter input port and a second inverter output port, the second inverter input port being coupled to the second side of the first switch;

a third inverter having a third inverter input port and a third inverter output port, the third inverter input port being coupled to the second inverter output port;

a third switch having a first side and a second side, the third switch being controlled by the complement of a second probe line, the first side of the third switch being coupled to the third inverter output port;

a fourth switch having a first side and a second side, the fourth switch being controlled by the first control signal, the first side of the fourth switch being coupled to the second side of the third switch, and the second side of the fourth switch being coupled to the second side of the first switch;

a fourth inverter having a fourth inverter input port and a fourth inverter output port, the fourth inverter input port being coupled to the second inverter output port;

a fifth switch having a first side and a second side, the fifth switch being controlled by the first control signal, the first side of the fifth switch being coupled to the fourth inverter output port;

a sixth switch having a first side and a second side, the sixth switch being controlled by a second control signal, the first side of the sixth switch being coupled to a second sense line, and the second side of the sixth switch being coupled to the second side of the fifth switch;

a fifth inverter having a fifth inverter input port and a fifth inverter output port, the fifth inverter input port being coupled to the second side of the fifth switch;

a sixth inverter having a sixth inverter input port and a sixth inverter output port, the sixth inverter input port being coupled to the fifth inverter output port;

a seventh switch having a first side and a second side, the seventh switch being controlled by the complement of the second control signal, the first side of the seventh switch being coupled to the sixth inverter output port;

an eighth switch having a first side and a second side, the eighth switch being controlled by the complement of the first control signal, the first side of the eighth switch being coupled to the second side of the seventh switch, and the second side of the eighth switch being coupled to the second side of the fifth switch; and a seventh inverter having a seventh inverter input port and a seventh inverter output port, the seventh inverter input port being coupled to the fifth inverter output port, and the seventh inverter output port being coupled to the data output port.

3. A method for generating a logic transition in an integrated circuit, the method employing a storage element comprising a master latch, a slave latch coupled to an input to a delay path, a first sense input port, and a second sense input port, the method comprising the steps of:

transmitting a first logic state into the master latch by means of the first sense input port;

latching the first logic state into the slave latch;

applying a second logic state to the slave latch from outside the storage element by means of the second sense input port; and causing the logic transition in the slave latch and on the input to the delay path from the first logic state to the second logic state by application of and in close synchronization with a first control signal, the logic transition occurring where the first logic state is different from the second logic state.

4. A storage element for generating a logic transition at an input to a delay path, the logic transition being closely synchronized with a first control signal, the storage element comprising:

a master latch;

a slave latch coupled to the master latch for receiving data from the master latch;

a first sense input port coupled to the master latch for transmitting a first logic state into the master latch;

a second sense input port coupled to the slave latch for applying a second logic state to the slave latch from outside the storage element, the second logic state replacing the first logic state in the slave latch upon application of the first control signal, thereby generating the logic transition in the slave latch where the first logic state is different from the second logic state;

a first switch controlled by the complement of the first control signal;

a data input port coupled to the master latch by means of the first switch through which data may be transmitted from the data input port to the master latch;

a second switch by which the slave latch is coupled to the master latch, and through which data may be transmitted from the master latch to the slave latch, the second switch being controlled by the first control signal;

a third switch by which the first sense input is coupled to the master latch, the third switch being controlled by a first probe signal;

a fourth switch by which the second sense input is coupled to the slave latch, the fourth switch being controlled by a second control signal; and a data output port coupled to the slave latch and the input to the delay path for transmitting the logic transition to the input to the delay path.

5. The method of claim 3 further comprising the steps of:

monitoring a pre-selected point in the delay path to determine when the logic transition has propagated along the delay path to the pre-selected point; and determining whether the logic transition has propagated to the pre-selected point within a specified period of time.

6. The method of claim 3 further comprising the steps of:

monitoring a pre-selected point in the delay path to determine when the logic transition has propagated along the delay path to the pre-selected point; and repeating the transmitting, latching, applying, causing, and monitoring-steps, each time decreasing the time between applications of the first control signal until the logic transition at the pre-selected point may no longer be detected before the next application of the first control signal.

* * * * *